United States Patent
Ota et al.

(10) Patent No.: US 7,256,604 B1
(45) Date of Patent: Aug. 14, 2007

(54) SEMICONDUCTOR DEVICE

(75) Inventors: Shusaku Ota, Osaka (JP); Hiroaki Segawa, Osaka (JP); Masanori Hirofuji, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/639,278

(22) Filed: Dec. 15, 2006

(30) Foreign Application Priority Data

Feb. 23, 2006 (JP) .............................. 2006-046368

(51) Int. Cl.
*G01R 31/26* (2006.01)
(52) U.S. Cl. ..................................... 324/765
(58) Field of Classification Search ..................... None
See application file for complete search history.

(56) References Cited

U.S. PATENT DOCUMENTS

| | | | |
|---|---|---|---|
| 5,111,059 A * | 5/1992 | Woodworth | 307/87 |
| 5,404,099 A | 4/1995 | Sahara | |
| 6,351,134 B2 | 2/2002 | Leas et al. | |
| 6,410,936 B1 | 6/2002 | Hongo | |
| 7,193,865 B2 * | 3/2007 | Balakrishnan et al. | 363/16 |
| 2002/0191469 A1 | 12/2002 | Honma et al. | |
| 2003/0219913 A1 | 11/2003 | Pourkeramati et al. | |
| 2005/0067899 A1 | 3/2005 | Kawanishi et al. | |
| 2005/0099862 A1 | 5/2005 | Lunde | |

* cited by examiner

*Primary Examiner*—Ha Tran Nguyen
*Assistant Examiner*—Trung Q. Nguyen
(74) *Attorney, Agent, or Firm*—McDermott Will & Emery LLP

(57) ABSTRACT

A power supply potential and a ground potential are supplied to a test-use power supply pad and a test-use ground pad, respectively. The power supply potential supplied to the test-use power supply pad is transferred to power supply lines and then to each circuit block via a test-use power supply line and a potential transfer circuit including a diode device. A voltage drop is caused by each of the diode devices. To cope with the voltage drop, however, respective sizes of the diode devices and resistance components of the potential transfer circuits are configured so that a uniform voltage drop is generated at each of the power supply lines.

17 Claims, 7 Drawing Sheets

SEMICONDUCTOR DEVICE

BACKGROUND OF THE INVENTION

The present invention relates to techniques for reducing the number of terminals requiring probes when probe testing and wafer level burn-in is performed in fabrication process steps for fabricating a semiconductor device.

In recent years, as the degree of shrinking and integration of semiconductor devices has been enhanced, development of system LSI has become mainstream. In a system LSI, integrated circuits having various different functions are placed within a single chip or a single package, and individual power supply systems and ground systems provided for the integrated circuits, respectively, have to be integrated as a single power supply system and a single ground system of the chip or of the package.

However, when influences of noise interference between a digital circuit and an analog circuit or between a plurality of analog circuits due to sharing of a power supply system and a ground system is not negligible, normally, using some kind of means, power supply systems and ground systems have to be separated. As a result, a plurality of power supply terminals and a plurality of ground terminals have to be provided. The number of required power supply terminals and ground terminals is increased as the degree of integration is increased.

In process steps for fabricating a semiconductor integrated circuit, as the degree of shrinking and integration has been enhanced, the number of chips obtained from a single wafer has been increased. Especially, since recent arrival of 300 mm wafer, this tendency has become more prominent. Therefore, in process steps of fabricating a semiconductor integrated circuit in mass production, how efficiently testing and burn-in can be performed at low cost has become a challenge.

One of the most effective solutions to this challenge is to examine a plurality of integrated circuits by a single test. Especially, in recent years, there are an increased number of cases where wafer level burn-in, i.e., burn-in to be performed at a wafer level, is applied even for packaged products and thus a stress can be applied to the integrated circuits in a lump for each wafer. In this testing technique, as the degree of integration is enhanced and the number of chips obtained from a single wafer is increased, its effects in efficiency and cost performance become larger. By the same token, in for probe testing, when the number of chips obtained from a single wafer is increased, an immense amount of time is required to test a single wafer, and therefore a plurality of semiconductor integrated circuits (e.g., 8, 16 or 32 semiconductor integrated circuits) are tested at the same time to increase efficiency and reduce costs for testing.

However, in this technique, the number of probes becomes a problem. Especially, in wafer level burn-in, since the number of probes provided per chip is limited because of restrictions for a burn-in equipment, it is not possible to apply probes to all pads of a system LSI at the same time. Needless to say, this problem more largely influences as the number of chips obtained from a single wafer is increased.

In addition, as has been described, in a system LSI, a plurality of different power supply systems exist and a large number of power supply terminals and ground terminals exist. Therefore, the number of pads requiring probes when wafer level burn-in is performed is likely to be increased and thus the number of probes becomes a more serious problem.

To solve this problem, according to a first known technique, respective power supply lines of a plurality of circuit blocks are connected to separate power supply pads, respectively, and a switch circuit is provided between a specific one of the power supply lines and each of the other ones of the power supply lines. When testing is performed, a power supply potential is applied to one of the power supply pads connected to the specific one of the power supply lines and the switch circuits are turned to be in a conduction state (see U.S. Pat. No. 5,404,099).

According to a second known technique, as a measure against ESD (electrostatic discharge), inter-power-supply protection transistors are provided so that each of the protection transistors is connected in parallel to each switch circuit between the power supply lines. As another option, each of the inter-power-supply protection transistors serves as a switch circuit between power supply lines (see United States Patent Application Publication No. 2005/0067899).

However, in each of the first and second known techniques, when wafer level burn-in is performed, a power supply potential is supplied to a plurality of circuit blocks via their respective switch circuits from a single power pad, so that a difference in potential level between power supply potentials of the plurality of circuit blocks is generated. The difference in potential level corresponds to an amount of a voltage drop due to an ON resistance of each switch circuit. Therefore, wafer level burn-in is performed in a state where respective potentials applied to the plurality of circuit blocks are different and a stress level becomes non-uniform in a semiconductor integrated circuit.

SUMMARY OF THE INVENTION

It is therefore an object of the present invention to provide a semiconductor device in which highly precise wafer level burn-in and simultaneous multiple probe testing can be performed.

To achieve the object, a semiconductor device according to the present invention includes: a plurality of circuit blocks each having an independent power supply system; a plurality of power supply lines connected to the plurality of circuit blocks, respectively; a plurality of power supply pads for supplying a potential to each of the plurality of power supply lines; a test-use power supply line being not directly connected to any one of the plurality of circuit blocks; a test-use power supply pad for supplying a potential to the test-use power supply line; and a plurality of potential transfer circuits for transferring a potential from the test-use power supply line to the plurality of power supply lines.

According to the present invention, a potential is transferred to the plurality of power supply lines from the test-use power supply line. Thus, in wafer level burn-in or simultaneous multiple probe testing, if a power supply potential is supplied to the test-use power supply pad, a uniform power supply potential is given to the plurality of circuit blocks. As a result, highly precise burn-in or testing can be performed without increasing the number of probes.

DESCRIPTION OF THE PREFERRED EMBODIMENTS

Hereafter, embodiments of the present invention will be described with reference to the accompanying drawings.

First Embodiment

Figure 1:
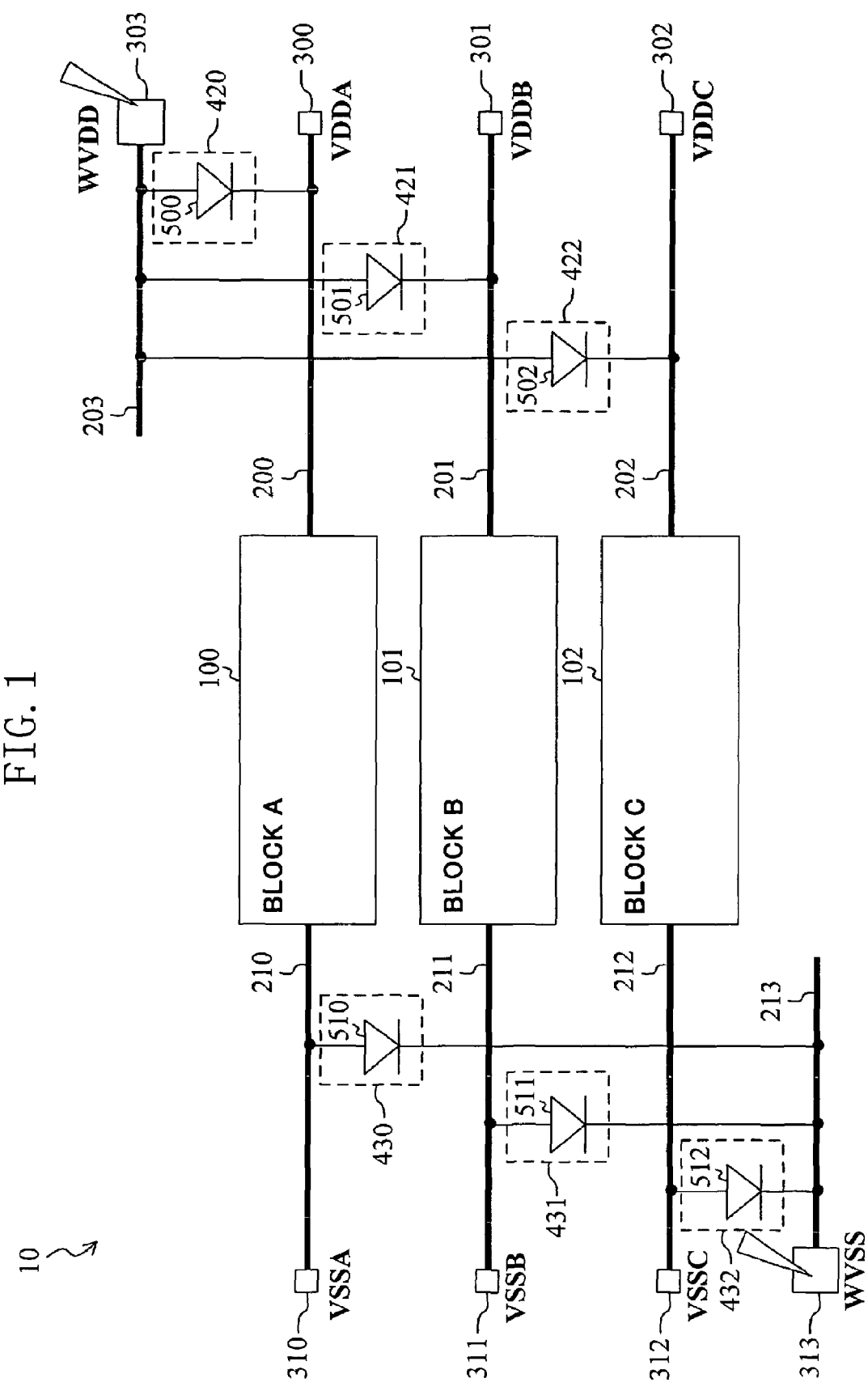
FIG. 1 is a block diagram illustrating a configuration of a semiconductor integrated circuit according to a first embodiment of the present invention.

FIG. 1 is a block diagram illustrating a configuration of a semiconductor integrated circuit according to a first embodiment of the present invention. In FIG. 1, a semiconductor integrated circuit 10 includes circuit blocks (blocks A, B and C) 100, 101 and 102. When each of the circuit blocks 100, 101 and 102 is in a normal operation mode, power supply voltages VDDA, VDDB and VDDC are supplied to the circuit blocks 100, 101 and 102 from power supply pads 300, 301 and 302, respectively, through respective power supply lines 200, 201 and 202. In the same manner, ground potentials VSSA, VSSB and VSSC are supplied to the circuit blocks 100, 101 and 102 from ground pads 310, 311 and 312, respectively, through respective ground lines 210, 211 and 212. The semiconductor integrated circuit 10 further includes a test-use power supply pad 303 and a test-use ground pad 313, and the test-use power supply pad 303 and the test-use ground pad 313 supply a power potential WVDD and a ground potential WVSS supplied from the outside to a test-use power supply line 203 and a test-use ground line 213, respectively. Each of the test-use power supply line 203 and the test-use ground line 213 is not directly connected to the circuit blocks 100, 101 and 102 and does not supply a power potential or a ground potential when the semiconductor integrated circuit 10 is actually used. Potential transfer circuits 420, 421 and 422 are connected between the test-use power supply line 203 and the power supply line 200, between the test-use power supply line 203 and the power supply line 201 and between the test-use power supply line 203 and the power supply line 202, respectively. The potential transfer circuits 420, 421 and 422 include as their components diode devices 500, 501 and 502, respectively. In the same manner, potential transfer circuits 430, 431 and 432 are connected between the test-use ground line 213 and the ground line 210, between the test-use ground line 213 and the ground line 211 and between the test-use ground line 213 and the ground line 212, respectively. The potential transfer circuits 430, 431 and 432 include, as their components, diode devices 510, 511 and 512, respectively.

Next, the operation of the semiconductor integrated circuit 10 having the configuration of FIG. 1 will be described. When wafer level burn-in or probe testing is performed, probes are made contact to each of the test-use power supply pad 303 and the test-use ground pad 313, and a power supply potential and a ground potential are supplied to the test-use power supply pad 303 and the test-use ground pad 313, respectively. The power supply potential supplied to the test-use power supply pad 303 is transferred to the power supply lines 200, 201 and 202 and then to the circuit blocks 100, 101 and 102 through the test-use power supply line 203 and the potential transfer circuits 420, 421 and 422 including the diode devices 500, 501 and 502. In this case, a voltage drop is generated by each of the diode devices 500, 501 and 502, but by configuring respective sizes of the diode devices 500, 501 and 502 and respective resistance components of the potential transfer circuits 420, 421 and 422 so that a uniform voltage drop is generated in the power supply lines 200, 201 and 201, wafer level burn-in and probe testing can be performed without causing a non-uniform voltage in the semiconductor integrated circuit 10.

In the same manner, the ground potential supplied to the test-use ground pad 313 is transferred to the ground lines 210, 211 and 212 and then to the circuit blocks 100, 101 and 102 through the test-use ground line 213 and the potential transfer circuits 430, 431 and 432 including the diode devices 510, 511 and 512. In this case, a voltage rise of the ground potential is caused by each of the diode devices 510, 511 and 512, but by configuring respective sizes of the diode devices 510, 511 and 512 and respective resistance components of the potential transfer circuits 430, 431 and 432 so that uniform voltage rise is caused in the ground lines 210, 211 and 212, wafer level burn-in and probe testing can be performed without causing a non-uniform voltage in the semiconductor integrated circuit 10.

An amount of a power supply voltage drop caused by each of the diode devices 500, 501 and 502 and an amount of a ground potential rise generated by each of the diode devices 510, 511 and 512 can be corrected by changing a voltage value supplied to each of the test-use power supply pad 303 and the test-use ground pad 313 and thus a burn-in stress level and a test voltage level are not reduced. Moreover, when wafer level burn-in is performed, probes are required only for the test-use power supply pad 303 and the test-use ground pad 313. Thus, the number of probes is not increased.

Note that in FIG. 1, a single pad is provided as each of the test-use power supply pad 303 and the test-use ground pad 313. However, as long as the number of probes is an allowable number, a plurality of pads may be provided as each of the test-use power supply pad 303 and the test-use ground pad 313.

Second Embodiment

Figure 2:
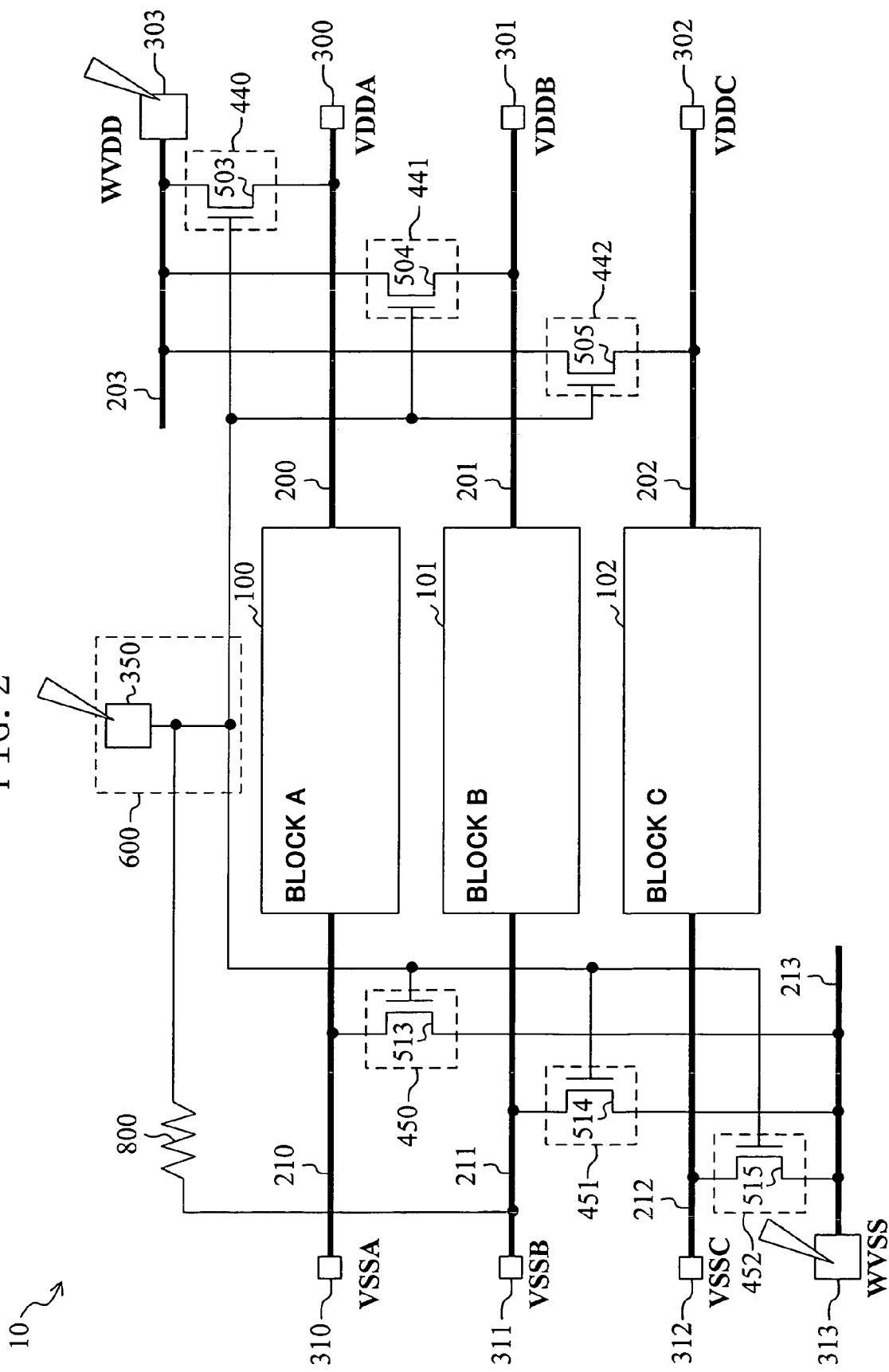
FIG. 2 is a block diagram illustrating a configuration of a semiconductor integrated circuit according to a second embodiment of the present invention.

FIG. 2 is a block diagram illustrating a configuration of a semiconductor integrated circuit according to a second embodiment of the present invention. The description of each member also shown in the first embodiment will be omitted.

Potential transfer circuits 440, 441 and 442 are connected between a test-use power supply line 203 and a power supply line 200, between the test-use power supply line 203 and a power supply line 201 and between the test-use power supply line 203 and a power supply lines 202, respectively. The potential transfer circuits 440, 441 and 442 include as their components switch circuits 503, 504 and 505 each being formed of an NMOS transistor, respectively. In the same manner, potential transfer circuits 450, 451 and 452 are connected between a test-use ground line 213 and a ground line 210, between the test-use ground line 213 and a ground line 211 and between the test-use ground line 213 and a ground line 212, respectively. The potential transfer circuits 450, 451 and 452 include as their components switch circuits 513, 514 and 515 each being formed of an NMOS transistor, respectively. Each of respective gates of the NMOS switch circuits 503, 504, 505, 513, 514 and 515 is connected to a conduction control use pad 350 provided in a conduction control circuit 600. By supplying a potential of a H level or a L level to the conduction control use pad 350, each of the switch circuits 503, 504, 505, 513, 514 and 515 is controlled to be in a conduction state or in a non-conduction state. Moreover, the conduction control use pad 350 is connected to one of the ground lines 210, 211 and 212 via a pull-down resistor 800.

Next, the operation of the semiconductor integrated circuit 10 having the configuration of FIG. 2 will be described. In wafer level burn-in or probe testing, a potential at which each of the switch circuits 503, 504, 505, 513, 514 and 515 is turned in a conduction state is supplied to the conduction control use pad 350, so that a conduction state is achieved between the power supply lines 200, 201 and 202 and between the ground lines 210, 211 and 212. Accordingly, a potential can be supplied from the test-use power supply pad 303 to the power supply lines 200, 201 and 202 via the switch circuits 503, 504 and 505, respectively, and from the test-use ground pad 313 to the ground lines 210, 211 and 212 via the switch circuits 513, 514 and 515, respectively. Therefore, the number of pads to be probed is three. That is, only the test-use power supply pad 303, the test-use ground pad 313 and the conduction control use pad 350 are required. In this case, as in the first embodiment, an amount of power supply voltage drop and an amount of ground potential rise generated by the switch circuits are corrected by adjusting respective transistor sizes of the NMOS switch circuits 503, 504, 505, 513, 514 and 515 and applying a voltage to the test-use power supply pad 303, the test-use ground pad 313 and the conduction control use pad 350. Moreover, because independent power supply systems are necessary in actual use, the conduction control use pad 350 is connected to the ground line 211 via the pull-down resistor 800 and, unless a potential is externally supplied to the conduction control use pad 350, the conduction control use pad 350 is controlled to have a potential at which each of the switch circuits 503, 504, 505, 513, 514 and 515 is turned in a non-conduction state.

According to the second embodiment, compared to the first embodiment, the number of probes is increased. However, in contrast to the first embodiment in which diode devices are used and each potential supplied to the circuit blocks 100, 101 and 102 drops or rises by a threshold voltage (Vt) of each of the diode devices with respect to a power potential and a ground potential respectively supplied to the test-use power supply pad 303 and the test-use ground pad 313, in the second embodiment, a potential is supplied to the conduction control use pad 350 to control each of the switch circuits 503, 504, 505, 513, 514 and 515 to be in a conduction state, so that a voltage drop or a voltage rise can be reduced to a level corresponding to an ON resistance of each switch.

Note that effects of voltage drop can be further reduced by replacing the NMOS switch circuits 503, 504 and 505 with PMOS switch circuits (not shown). In such a case, an inverter (not shown) is provided between the conduction control use pad 350 and a gate signal of each of the PMOS switch circuits to control each of the PMOS switch circuits to be in a conduction state or in a non-conduction state with a reverse signal of a signal input from the conduction control use pad 350. Alternatively, instead of the pull-down resistor 800 connected to the conduction control use pad 350, a pull-up resistor (not shown) may be provided to form a configuration in which unless a ground potential is externally supplied to the conduction control use pad 350, each of the PMOS switch circuits are turned to be in a non-conduction state, and thus an inverter circuit (not shown) may be provided between the conduction control use pad 350 and a gate signal of each of the NMOS switch circuits 513, 514 and 515 to control each of the NMOS switch circuits 513, 514 and 515 to be in a conduction state or in a non-conduction state with a reverse signal of a signal input from the conduction control use pad 350.

In the second embodiment of the present invention shown in FIG. 2, as an example, the configuration in which switch circuits are added as the potential transfer circuits 440, 441, 442, 450, 451 and 452 has been described. However, inter-power-supply protection transistors provided in an ESD protective circuit can be used to achieve the same effects.

Third Embodiment

Figure 3:
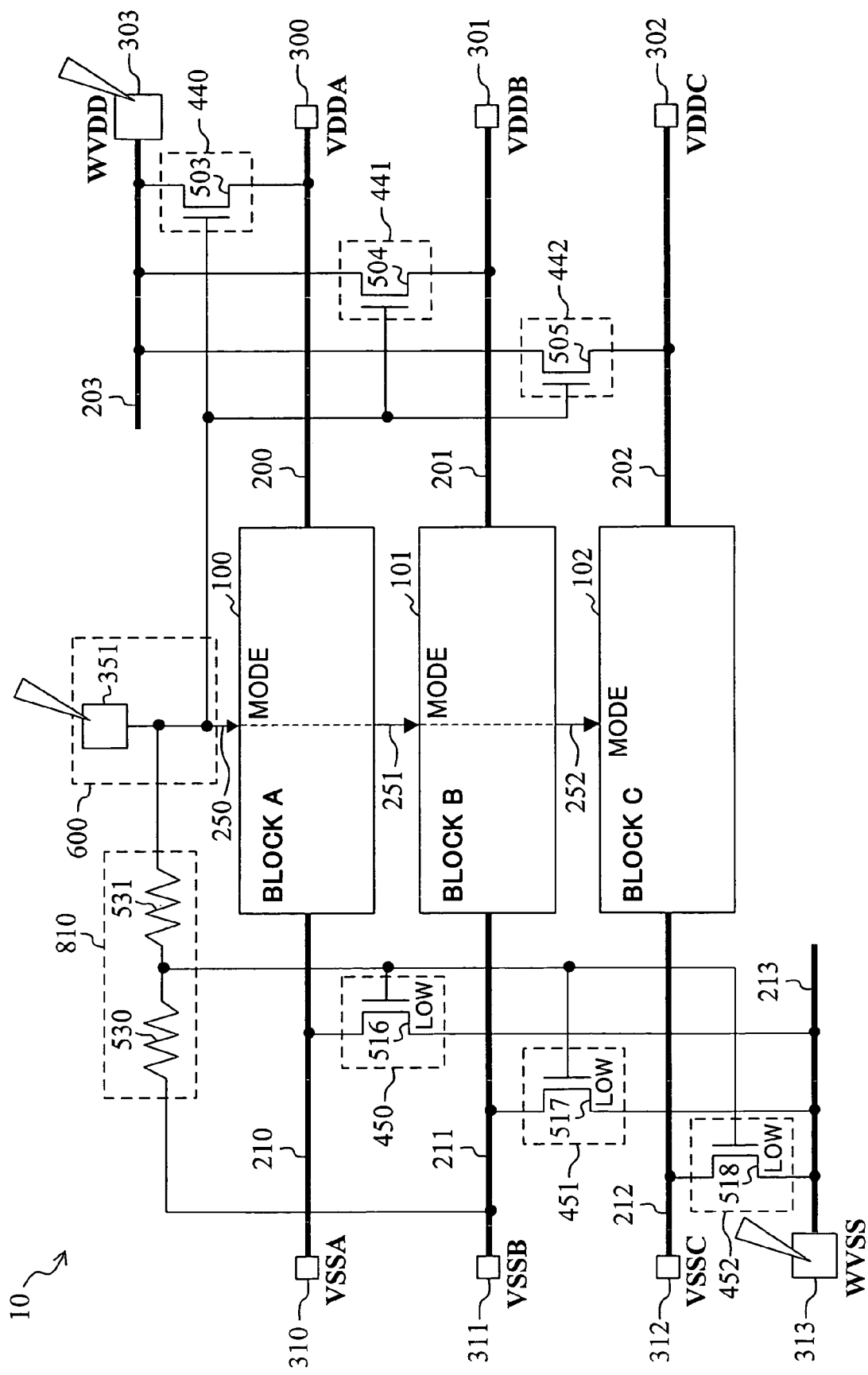
FIG. 3 is a block diagram illustrating a configuration of a semiconductor integrated circuit according to a third embodiment of the present invention.

FIG. 3 is a block diagram illustrating a configuration of a semiconductor integrated circuit according to a third embodiment of the present invention. Description of each member also shown in the first and second embodiments will be omitted.

A semiconductor integrated circuit 10 includes a test mode determination pad 351. The test mode determination pad 351 is connected to circuit blocks 100, 101 and 102 through test mode signal lines 250, 251 and 252, respectively. The test mode determination pad 351 is connected to any one of ground lines 210, 211 and 212 via a level shifter 810. The level shifter 810 has a configuration including two resistor devices 530 and 531 connected in series. A potential signal generated according to the resistance ratio between the resistor devices 530 and 531 is connected as a gate signal to each of respective low break-down voltage NMOS switch circuits 516, 517 and 518 of the potential transfer circuits 450, 451 and 452. Respective gates of NMOS switch circuits 503, 504 and 505 constituting potential transfer circuits 440, 441 and 442, respectively, are directly connected to the test mode determination pad 351.

Next, the operation of the semiconductor integrated circuit 10 having the configuration of FIG. 3 will be described. When a specific potential is supplied to the test mode determination pad 351, the semiconductor integrated circuit 10 and the circuit blocks 100, 101 and 102 as its components are set to be in a wafer level burn-in test mode or in an arbitrary test mode through the test mode signal lines 250, 251 and 252. Also, when the specific potential is supplied to the test mode determination pad 351, each of the NMOS switch circuits 503, 504 and 505 constituting the potential transfer circuits 440, 441 and 442, respectively, is turned to be in a conduction state and performs the same operation as that described in the first and second embodiments, so that a power supply voltage is supplied from a test-use power supply pad 303 to the circuit blocks 100, 101 and 102. In the level shifter 810, a potential is generated by voltage dividing of a potential supplied from the test mode determination pad 351 using the resistance ratio between the resistor devices 530 and 531 and an obtained potential is transferred to respective gates of NMOS switch circuits 516, 517 and 518 constituting potential transfer circuits 450, 451 and 452, respectively, in a subsequent stage. Each of the NMOS switch circuits 516, 517 and 518 is turned to be in a conduction state and performs the same operation as that described in the first and second embodiments, so that a ground potential is supplied from a test-use ground pad 313 to the circuit blocks 100, 101 and 102.

In the second embodiment, each of respective transistors of the potential transfer circuits 440, 441, 442, 450, 451 and 452 is controlled by the conduction control use pad 350 to be in a conduction state or in a non-conduction state. However, normally, when wafer level burn-in or probe testing is performed, as described above, it is general that the semiconductor integrated circuit 10 is set to be in an arbitrary test mode and then testing is performed. In such a case, the semiconductor integrated circuit 10 is set to be in an arbitrary test mode and thus at least one pad is needed. In the third embodiment, however, using a pad necessary for a certain test mode setting, the transistors of the potential transfer circuits 440, 441, 442, 450, 451 and 452 are controlled to be in a conduction state or in a non-conduction state, so that the number of probes necessary for wafer level burn-in and probe testing is reduced. Moreover, a voltage level of a signal for controlling the NMOS switch circuits 516, 517 and 518 constituting the potential transfer circuits 450, 451 and 452, respectively, is reduced by the level shifter 810. Thus, respective break-down voltages of the NMOS switch circuits 516, 517 and 518 can be reduced, so that an area of each switch circuit can be effectively reduced.

Fourth Embodiment

Figure 4:
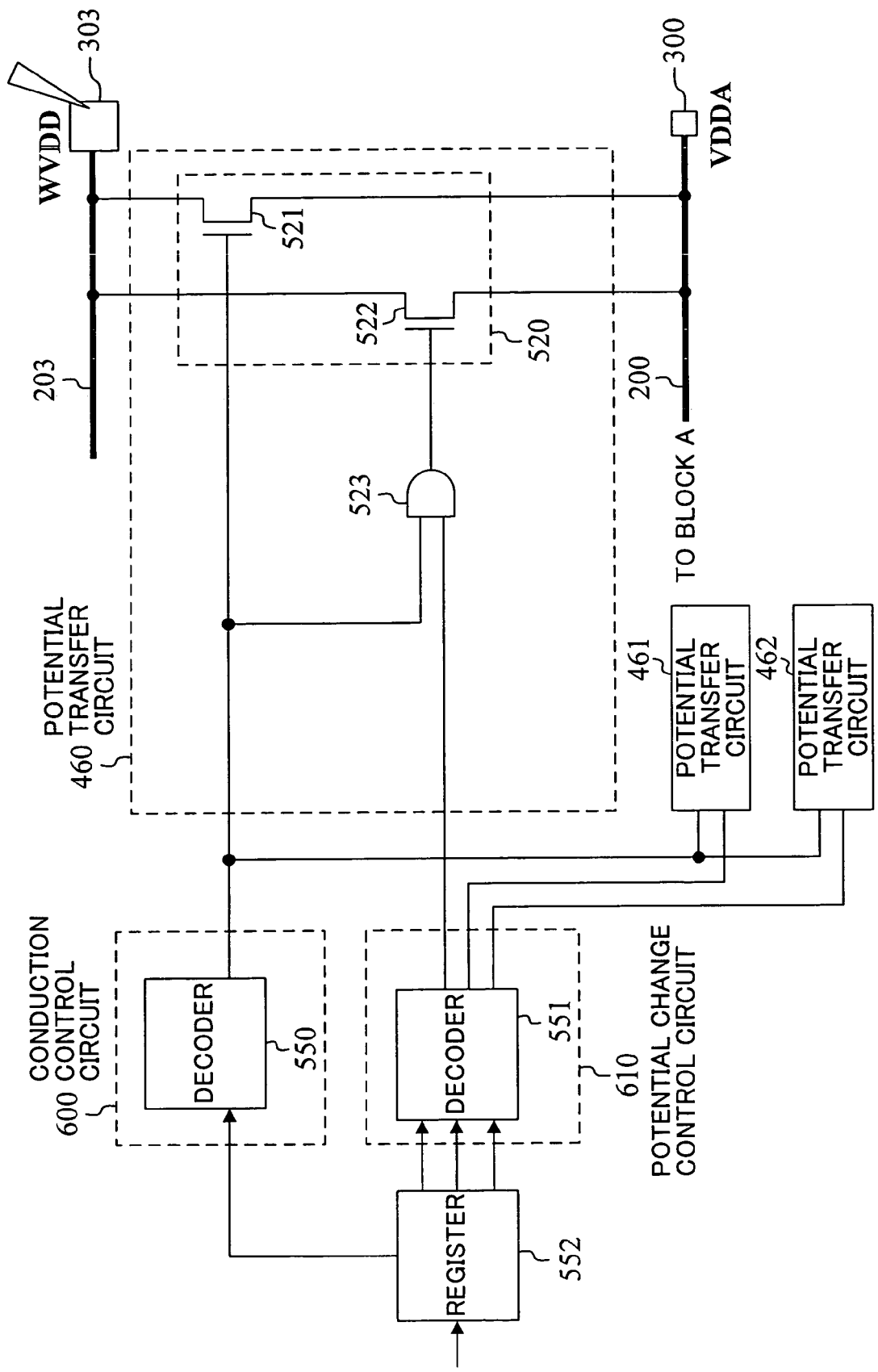
FIG. 4 is a block diagram illustrating a configuration of a semiconductor integrated circuit according to a fourth embodiment of the present invention.

FIG. 4 is a block diagram illustrating a configuration of a control system for potential transfer circuits 460, 461 and 462 according to a fourth embodiment of the present invention. The description of each member also shown in the first through third embodiments will be omitted.

The potential transfer circuit 460 includes a parallel switch circuit 520 which includes two NMOS switch circuits 521 and 522 and is connected between a test-use power supply line 203 and a power supply line 200. One of the two switch circuits of the parallel switch circuit 520, i.e., the switch circuit 521 has a gate directly connected to a conduction control circuit 600 and the other one, i.e., the switch circuit 522 is connected to the conduction control circuit 600 and a potential change control circuit 610 via an AND circuit 523. The conduction control circuit 600 includes a conduction control signal decoder 550 and is connected so as to receive a signal output from a register 552 provided in the semiconductor integrated circuit and then output a conduction control signal to the potential transfer circuits 460, 461 and 462. The potential change control circuit 610 includes a potential change control signal decoder 551 for decoding an output of the register 552. An output signal of the potential change control signal decoder 551 is connected to the potential transfer circuits 460, 461 and 462. Note that in FIG. 4, for the purpose of simplification, only the configuration of the potential transfer circuit 460 is illustrated. However, each of the potential transfer circuits 461 and 462 has the same configuration as that of the potential transfer circuit 460.

Next, the operation of the semiconductor integrated circuit having the configuration of FIG. 4 will be described. When an instruction for executing conduction control for the potential transfer circuits 460, 461 and 462 is stored in the register 552, according to the instruction, the decoder 550 in the conduction control circuit 600 outputs a conduction control signal to the potential transfer circuits 460, 461 and 462. When each of the potential transfer circuits 460, 461 and 462 receives the conduction control signal from the conduction control circuit 600, at least the NMOS switch circuit 521 in the parallel switch circuit 520 is turned to be in a conduction state and performs the same operation as that described in the third embodiment to supply a power potential to the circuit blocks 100, 101 and 102 (not shown) from a test-use power supply pad 303.

The register 552 has the function of storing an instruction for executing control over the number of switch circuits to be turned in a conduction state in the parallel switch circuit 520 in each of the potential transfer circuits 460, 461 and 462. For example, when an instruction for executing control so that both of the two NMOS switch circuits 521 and 522 of the parallel switch circuit 520 in the potential transfer circuit 460 are turned to be in a conduction state is stored in the register 552, the decoder 551 in the potential change control circuit 610 transfers a H level signal to the potential transfer circuit 460 according to an output of the register 552. In the potential transfer circuit 460, the AND circuit 523 is activated by the H level signal output by the potential change control signal decoder 551 and each of the switch circuits 521 and 522 in the parallel switch circuit 520 is controlled to be in a conduction state. As a result, the parallel switch circuit 520 is controlled so that the two switch circuits 521 and 522 are to be in a conduction state. Thus, a power supply potential is supplied to the power supply line 200 from a test-use power supply pad 303 via the two switch circuits 521 and 522. By making a plurality of switch circuits 521 and 522 be in a conduction state, an ON resistance due to the parallel switch circuit 520 can be halved and thus a voltage drop can be halved.

In the semiconductor integrated circuit having the configuration of FIG. 4, even when an amount of a current consumed by each of the plurality of circuit blocks 100, 101 and 102 is uncertain in advance, an ON resistance can be selectively controlled to be half by giving an instruction to the register 552 according to the amount of current consumption. Accordingly, it becomes possible to give flexibility to specification determination and design constraints and also, at the same time, to maintain voltage uniformity in the semiconductor integrated circuit.

Note that in FIG. 4, the parallel switch circuit 520 is configured to include the two NMOS switch circuits 521 and 522. However, the number of NMOS switch circuits is not limited. Needless to say, the parallel switch circuit 520 may include an arbitrary number of NMOS switch circuits. As described above, each switch circuit may be formed of a PMOS transistor.

Figure 5:
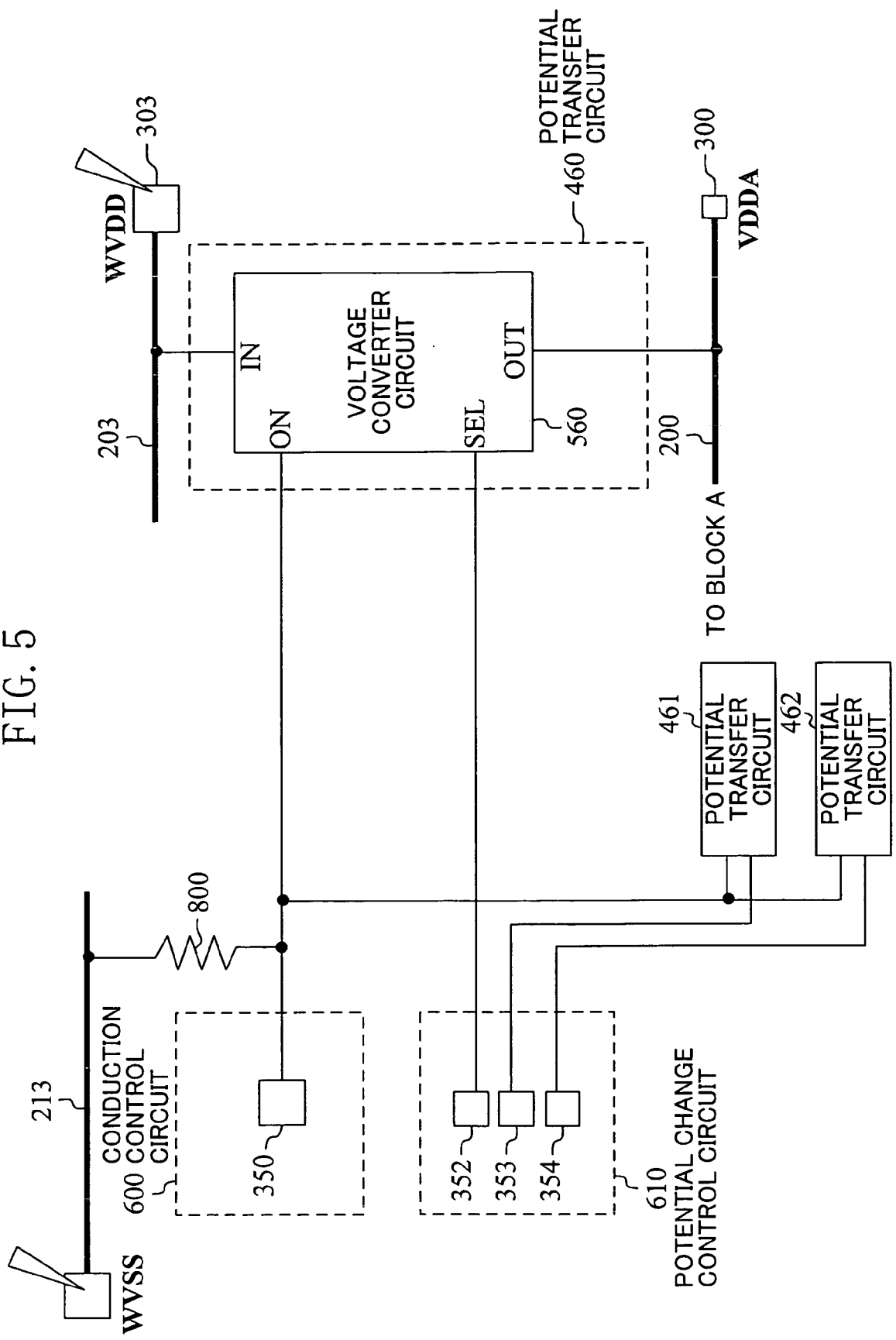
FIG. 5 is a block diagram illustrating a modified example of the semiconductor integrated circuit of FIG. 4.

Moreover, in FIG. 4, the conduction control circuit 600 generates a conduction control signal by the decoder 550. However, as shown in FIG. 5, even when the conduction control use pad 350 described in the second embodiment or the test mode determination pad 351 described in the third embodiment is used, the same effects can be achieved. Furthermore, in the potential change control circuit 610, instead of the decoder 551, as shown in FIG. 5, external change control pads 352, 353 and 354 may be provided within an allowable range of the number of probes to control a voltage drop amount by the external change control pads 352, 353 and 354. Moreover, in FIG. 4, a voltage drop amount is controlled by the parallel switch circuit 520. However, as further shown in FIG. 5, a voltage conversion circuit 560 such as a regulator and the like may be provided to control a voltage drop amount in the voltage conversion circuit 560 according to an output of the potential change control circuit 610.

Furthermore, in FIG. 4 and FIG. 5, the configurations and operations of the potential transfer circuits 460, 461 and 462 connected between the test-use power supply line 203 and the power supply line 200, between the test-use power supply line 203 and the power supply line 201 and between the test-use power supply line 203 and the power supply line 202, respectively, have been described. However, in the potential transfer circuits 450, 451 and 452 connected between the test-use ground line 213 and the ground line 210, between the test-use ground line 213 and the ground line 211 and between the test-use ground line 213 and the ground lines 212, respectively, an amount of a ground potential rise can be controlled by the same configurations and operations as those described in FIG. 4 and FIG. 5.

Fifth Embodiment

Figure 6:
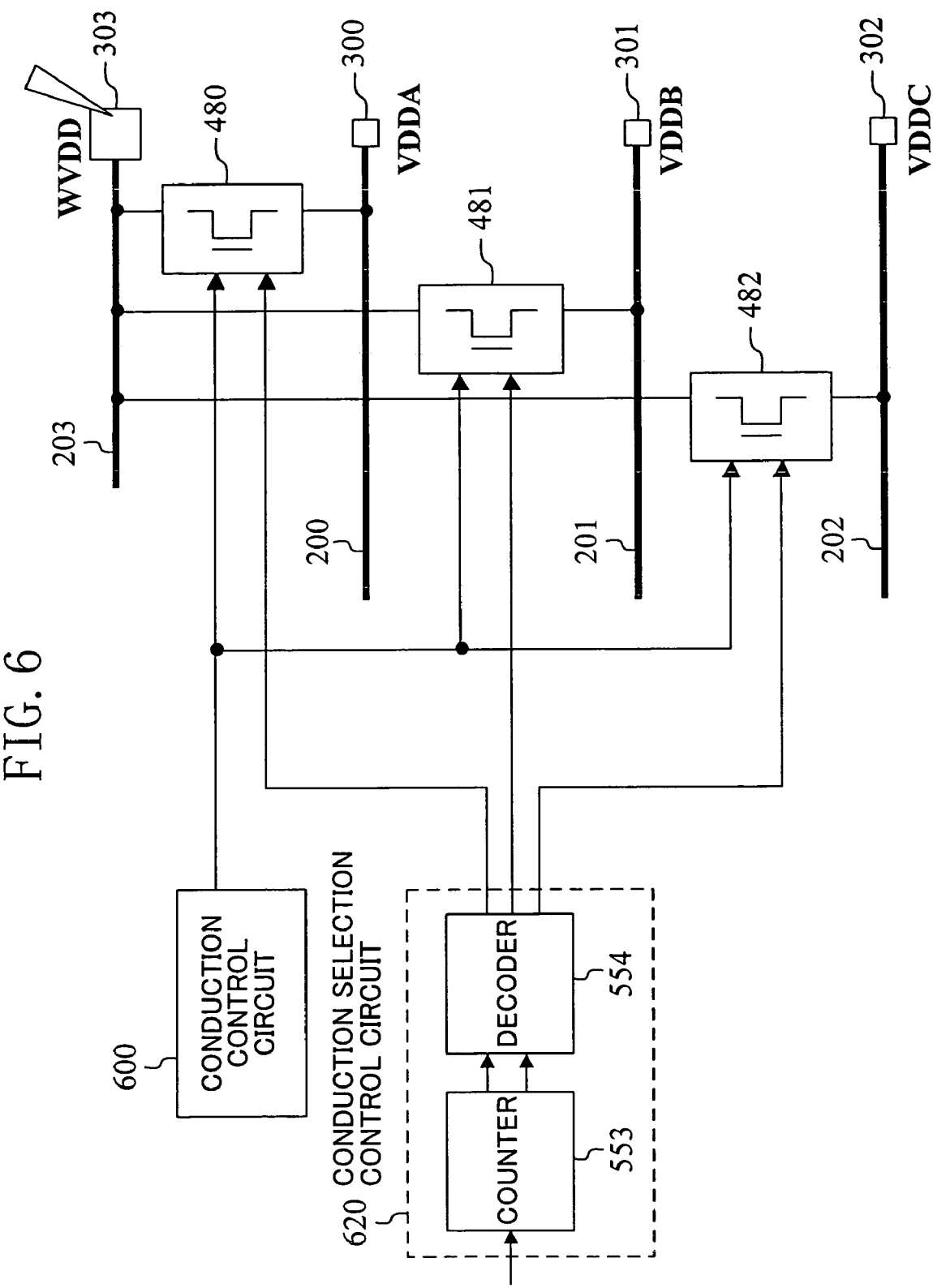
FIG. 6 is a block diagram illustrating a configuration of a semiconductor integrated circuit according to a fifth embodiment of the present invention.

FIG. 6 is a block diagram illustrating a configuration of a control system for potential transfer circuits 480, 481 and 482 according to a fifth embodiment of the present invention. The description of each member also shown in the first through third embodiments will be omitted.

A conduction selection control circuit 620 includes a counter 553 and a conduction selection control signal decoder 554. The conduction selection control signal decoder 554 is connected so as to transfer a conduction selection control signal to each of the potential transfer circuits 480, 481 and 482 provided in a subsequent stage, according to a count value output by the counter 553. Each of the potential transfer circuits 480, 481 and 482 is configured to receive as inputs two signals, i.e., one of outputs of the conduction selection control signal decoder 554 and a conduction control signal output from a conduction control circuit 600. Each of the potential transfer circuits 480, 481 and 482 is controlled to be in a conduction state or in a non-conduction state.

Next, the operation of the semiconductor integrated circuit having the configuration of FIG. 6 will be described. The counter 553 in the conduction selection control circuit 620 updates a count value according to an external clock or a count up (down) signal replacing the external clock signal. When the counter 553 outputs a predetermined, desired value, the conduction selection control signal decoder 554 outputs a conduction selection control signal to one of the potential transfer circuits 480, 481 and 482 in the subsequent stage which is designated by the count number. Note that plural predetermined count values may be set in the decoder 554.

Each of the potential transfer circuits 480, 481 and 482 is controlled to be in a conduction state when a corresponding conduction selection control signal is output by the conduction selection control circuit 620 and a conduction control signal is output by the conduction control circuit 600. Accordingly, every time when the counter 553 updates its count value, a potential transfer circuit which is to be controlled in a conduction state is changed according to the count value and a circuit block to which a power supply potential is supplied from the test-use power supply pad 303 is changed.

In the semiconductor integrated circuit having the configuration of FIG. 6, when a current consumed in performing wafer level burn-in or probe testing exceeds a current tolerance of the testing equipment, probe or test-use power supply pad 303, an amount of a current flowing in the test-use power supply pad 303 can be reduced by performing time sharing control to the operation of each of the potential transfer circuits 480, 481 and 482. Thus, the consumption current can be controlled to be within a range of the current tolerance of the equipment, probe or pad.

Figure 7:
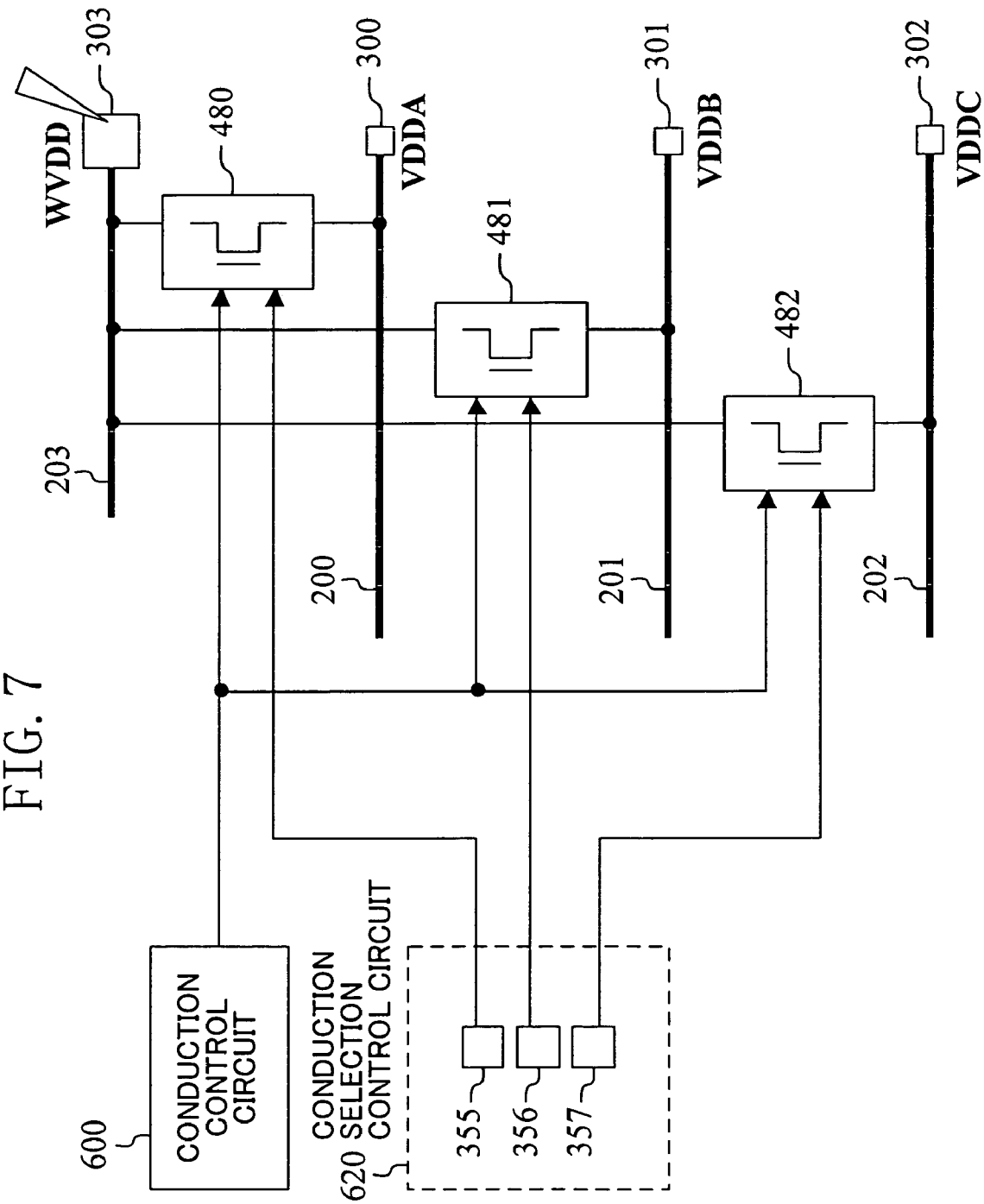
FIG. 7 is a block diagram illustrating a modified example of the semiconductor integrated circuit of FIG. 6.

Note that in FIG. 6, as a component of the conduction selection control circuit 620, the counter 553 is used. However, instead of the counter 553, a register can be provided. A potential transfer circuit which is to be controlled in a conduction state can be changed by generating a conduction selection control signal in the decoder 554 according to an updated output of the register. Moreover, as shown in FIG. 7, within an allowable range of the number of probes, external selection pads 355, 356 and 357 can be provided in the conduction selection control circuit 620 so that a conduction selection control signal is directly supplied from the external selection pads 355, 356 and 357. In such a case, an area for each of the counter 553 and the decoder 554 can be also reduced.

Note that in FIG. 6 and FIG. 7, the configuration and operation for the potential transfer circuits 480, 481 and 482 connected between the test-use power supply line 203 and the power supply line 200, between the test-use power supply line 203 and the power supply line 201 and between the test-use power supply line 203 and the power supply line 202, respectively, have been described. However, in the potential transfer circuits 450, 451 and 452 connected between the test-use ground line 213 and the ground line 210, between the test-use ground line 213 and the ground line 211 and between the test-use ground line 213 and the test-use ground line 212, respectively, an amount of a current flowing in the test-use ground pad 313 can be controlled by the same configurations and operations as those described in FIG. 6 and FIG. 7.

As has been described, in a semiconductor device according to the present invention, highly precise wafer level burn-in and simultaneous multiple probe testing can be performed. Therefore, the semiconductor device of the present invention is useful as a semiconductor integrated circuit and the like with an increased degree of integration.

What is claimed is:

1. A semiconductor device comprising:
   a plurality of circuit blocks each having an independent power supply system;
   a plurality of power supply lines connected to the plurality of circuit blocks, respectively;
   a plurality of power supply pads for supplying a potential to each of the plurality of power supply lines,
   a test-use power supply line being not directly connected to any one of the plurality of circuit blocks;
   a test-use power supply pad for supplying a potential to the test-use power supply line; and
   a plurality of potential transfer circuits for transferring a potential from the test-use power supply line to the plurality of power supply lines.

2. The semiconductor device of claim 1, further comprising:
   a plurality of ground lines connected to the plurality of circuit blocks, respectively;
   a plurality of ground pads for supplying a potential to each of the plurality of ground lines;
   a test-use ground line being not directly connected to any one of the plurality of circuit blocks;
   a test-use ground pad for supplying a potential to the test-use ground line; and
   a plurality of potential transfer circuits for transferring a potential from the test-use ground line to the plurality of ground lines.

3. The semiconductor device of claim 1, wherein each of the plurality of potential transfer circuits includes a diode.

4. The semiconductor device of claim 1, further comprising a conduction control circuit for controlling each of the plurality of potential transfer circuits to be in a conduction state or in a non-conduction state,
   wherein each of the plurality of potential transfer circuits includes a switch circuit controlled to be in a conduction state or in a non-conduction state according to a conduction control signal output from the conduction control circuit.

5. The semiconductor device of claim 4, wherein the switch circuit includes an inter-power-supply protection transistor controlled to be in a conduction state or in a non-conduction state.

6. The semiconductor device of claim 4, wherein the conduction control circuit includes a conduction control use pad for receiving a conduction control signal from the outside.

7. The semiconductor device of claim 4, further comprising a test mode determination pad for receiving from the outside a test mode signal for setting the plurality of circuit blocks to be in a test mode, wherein the conduction control circuit generates the conduction control signal from the test mode signal.

8. The semiconductor device of claim 4, further comprising a level shifter for shifting down a voltage level of a signal received from an external pad and transferring the signal to each of the plurality of potential transfer circuits.

9. The semiconductor device of claim 4, wherein the conduction control circuit includes a decoder for generating the conduction control signal.

10. The semiconductor device of claim 4, further comprising a potential change control circuit for controlling respective transfer potentials of the plurality of potential transfer circuits, wherein each of the plurality of potential transfer circuits includes a parallel switch circuit having a plurality of switch circuits connected to each other in parallel, and wherein in the parallel switch circuit, each of the plurality of switch circuits is controlled to be in a conduction state or in a non-conduction state according to the conduction control signal output from the conduction control circuit and a potential change control signal output from the potential change control circuit.

11. The semiconductor device of claim 10, wherein the potential change control circuit includes a decoder for generating the potential change control signal.

12. The semiconductor device of claim 10, wherein each of the plurality of potential transfer circuits includes a voltage converter circuit having a function of adjusting transfer potential and being controlled to be in a conduction state or in a non-conduction state according to the conduction control signal output from the conduction control circuit and the potential change control signal output from the potential change control circuit.

13. The semiconductor device of claim 10, wherein the potential change control circuit includes an external change control pad for receiving the potential change control signal from the outside.

14. The semiconductor device of claim 4, further comprising a conduction selection control circuit for selecting which one of the plurality of potential transfer circuits is to be operated and controlling selected one of the plurality of potential transfer circuits, wherein each of the plurality of potential transfer circuits is controlled to be in a conduction state or in a non-conduction state according to a conduction selection control signal output from the conduction selection control circuit and the conduction control signal output from the conduction control circuit.

15. The semiconductor device of claim 14, wherein the conduction selection control circuit includes a decoder for generating the conduction selection control signal.

16. The semiconductor device of claim 14, wherein the conduction selection control circuit includes a counter for subsequently designating the plurality of potential transfer circuits.

17. The semiconductor device of claim 14, wherein the conduction selection control circuit includes an external selection pad for receiving the conduction selection control signal from the outside.

* * * * *